United States Patent [19]

Pagano et al.

[11] Patent Number: 5,602,847
[45] Date of Patent: Feb. 11, 1997

[54] SEGREGATED SPECTRUM RF DOWNCONVERTER FOR DIGITIZATION SYSTEMS

[75] Inventors: Carmine J. Pagano, Blairstown; Jack C. Wen, Parsippany, both of N.J.

[73] Assignee: Lucent Technologies Inc., Murray Hill, N.J.

[21] Appl. No.: 534,773

[22] Filed: Sep. 27, 1995

[51] Int. Cl.⁶ .................................................... H04J 1/05
[52] U.S. Cl. ......................... 370/484; 370/497; 329/341; 455/266
[58] Field of Search ........................... 370/70, 123, 69.1, 370/50, 38, 39; 329/341, 342, 343, 327, 364; 375/216, 316; 455/266, 339, 190.1

[56] References Cited

U.S. PATENT DOCUMENTS

| 4,893,316 | 1/1990 | Jane et al. | 375/44 |
| 5,289,464 | 2/1994 | Wang | 370/69.1 |
| 5,493,721 | 2/1996 | Reis | 455/266 |

Primary Examiner—Douglas W. Olms
Assistant Examiner—Matthew C. Phillips

[57] ABSTRACT

Disclosed is an apparatus for digitizing an electromagnetic input signal having frequency components within at least first and second segregated frequency bands, particularly useful in a wireless communications system. The apparatus includes a filtering circuit arrangement for passing only frequency components of the input signal substantially within the first and second frequency bands, to provide a filtered signal having a spectrum with spectral components below a predetermined power level within a frequency gap between the first and second frequency bands. An analog to digital (A/D) converter samples the filtered signal at a sampling rate sufficient to provide a digitized output signal with a frequency spectrum corresponding to that of the filtered signal and also with a replica of spectral components of one of the frequency bands appearing within the frequency gap. Preferably, the sampling rate used is less than the Nyquist sampling rate for the composite frequency band extending from the lowest to highest frequencies of the two bands. This allows a single A/D converter to be employed to sample the filtered signal, even when a large frequency gap exists between the segregated bands. A single mixer stage can then be used in conjunction with the single A/D converter in a wireless communications receiver application.

19 Claims, 5 Drawing Sheets

SEGREGATED SPECTRUM RF DOWNCONVERTER FOR DIGITIZATION SYSTEMS

FIELD OF THE INVENTION

This invention relates to a radio frequency (RF) downconverter useful for down-convening electromagnetic signals within non-contiguous bands of frequencies. More specifically, it relates to such an RF down-converter in combination with an analog to digital (A/D) converter, which combination is particularly useful in wireless communications applications.

BACKGROUND OF THE INVENTION

In the wireless communications industry, a given service provider is often granted two or more non-contiguous or segregated frequency bands to be used for the wireless transmission and reception of RF communications channels. In order to minimize system hardware costs, it behooves such a provider to utilize a common receiver for the simultaneous reception and processing of signals within the segregated frequency bands. However, the wider the separation between the bands, the more complex the receiver typically becomes.

Figure 1:
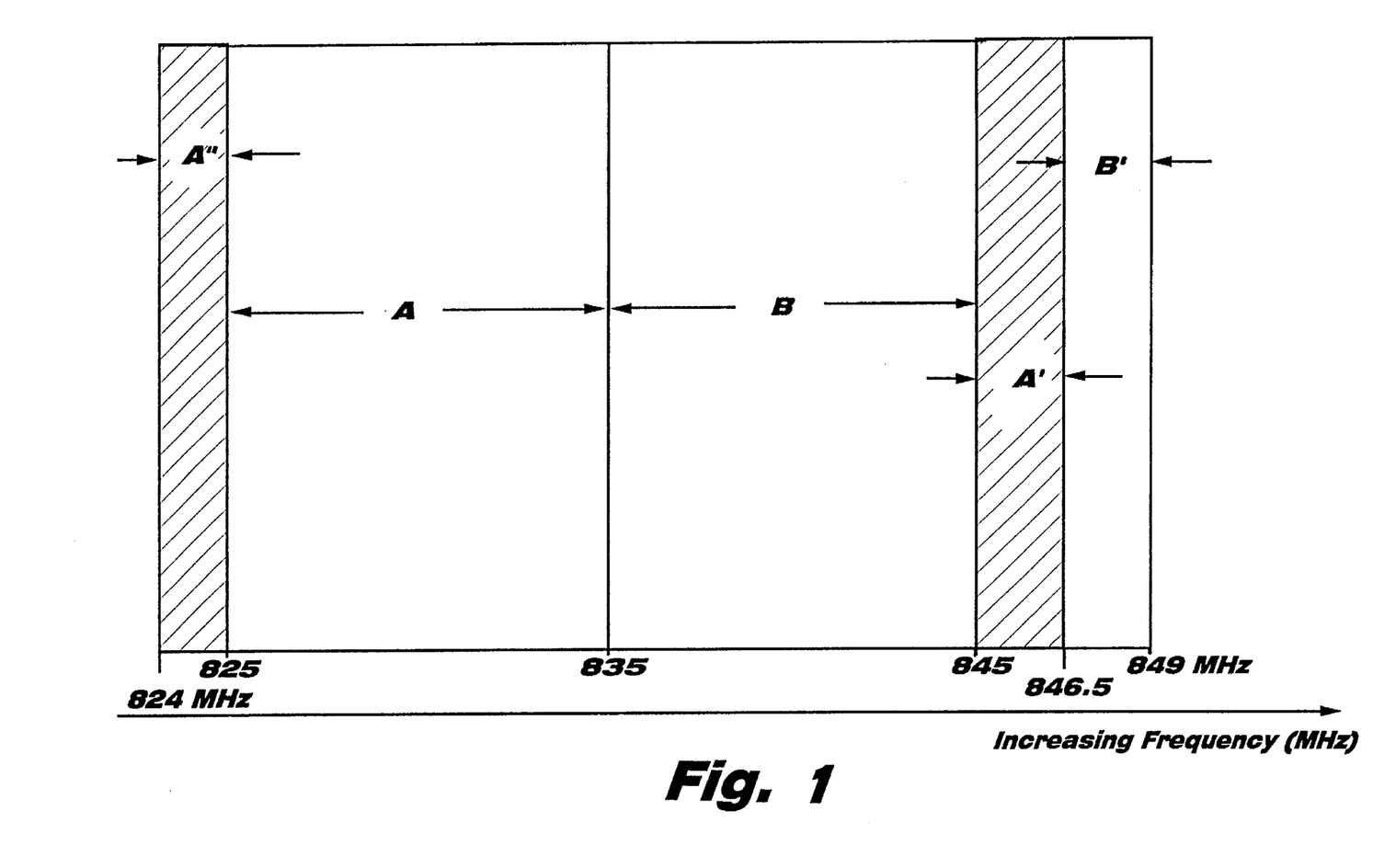
FIG. 1 is an illustration of typical non-contiguous frequency bands used in wireless communications.

As shown in FIG. 1, a typical problem with spectrum allocation is that the segregated spectrums may be granted to a given provider with varying frequency gaps therebetween. In the United States, an "A" band provider transmitting and receiving frequency channels within the shown A, A' and A" bands has a 10 MHz discontinuity (835–845 MHz) between its first frequency block (the A and A" bands) and its second frequency block (the A' band). On the other hand, a "B" band provider using the B and B' frequency bands only has a 1.5 MHz separation (845–846.5 MHz) therebetween.

In digitization receiving systems, A/D converters are usually employed to digitize the modulated analog signals received on the communications channels. With these systems, the challenge of the designer is to capture the desired bands of frequencies while minimizing the sampling rate of the A/D converter, to thereby minimize the amount of data a digital signal processor (DSP) would have to process. This also allows for the use of lower sampling rate A/D converters, thereby having a positive impact on cost and performance. Concomitantly, it is desirable to minimize the amount of hardware required to achieve this goal.

If the desired frequency bands are separated by a small frequency gap or are contiguous, the achievement of the above stated goal would be relatively straightforward— simply, the A/D converter would just have to sample at slightly more than twice the bandwidth of the composite frequency bands (i.e., slightly more than the Nyquist sampling rate for the composite frequency bands). However, if the desired bands of frequencies are separated by a large gap, the A/D converter would have to sample at a high enough rate such that its Nyquist bandwidth encompasses the two bands of frequencies including the large gap. This approach is inefficient because the A/D converter is also sampling the frequency gap which contains useless information. It is therefore desirable to reduce that gap by moving the two non-contiguous bands closer together so that they will fit within a smaller Nyquist bandwidth. The Nyquist bandwidth would have some amount of margin around all sides of the two noncontiguous frequency bands to allow for filter rolloffs and interference from aliasing.

Conventionally, the frequency gap is reduced by using a down-conversion stage for each of the frequency bands to down-convert and to manipulate the placement of each frequency band at intermediate frequencies (IF) such that the frequency bands are closer together. For two frequency bands that require down-conversion, this will always mean a minimum of two mixer stages (i.e., two mixers and two local oscillators). Since mixer stages usually account for a substantial portion of a down-converter's cost, it would be advantageous to eliminate a mixer stage whenever possible. Also, multiple local oscillators create more difficulty in designing and laying out circuits because of the additional care which must be taken to shield and isolate the local oscillator signals.

Alternatively, if only one mixer stage is used, then separate A/D converters are needed to digitize each of the frequency bands independently. That is, the single mixer stage would downconvert both frequency bands to IF. Then the IF would be divided into two separate paths with each path bandpass filtering a different frequency band. The output of each path would then be digitized by separate A/D converters. This approach adds another A/D converter which increases the complexity of the design as well as the cost. Moreover, steps must be taken to ensure adequate isolation of the two A/D converters, inasmuch as their spurious outputs must be contained.

SUMMARY OF THE INVENTION

Briefly, in accordance with a preferred embodiment of the invention, there is provided a system for digitizing an electromagnetic RF input signal having frequency components within at least first and second segregated RF frequency bands. The system preferably includes a mixer stage for down-converting the RF input signal to an IF signal, and first and second bandpass filters for passing only frequency components of the IF signal substantially within down-converted first and second frequency bands. This results in a filtered signal having a spectrum with spectral components below a predetermined power level within a frequency gap between the down-converted first and second frequency bands. An A/D converter samples the filtered signal to provide a digitized output signal with a periodic, overlapping spectrum.

The periodic spectrum includes the spectrum of the filtered signal at corresponding frequencies thereof, with a replica of the spectral components of one of the frequency bands appearing within the frequency gap created by the filtering. The replicated frequency band within the frequency gap can then be digitally processed together with the other frequency band without loss of signal information because there is no interference from the filtered portion of the unwanted spectrum. Accordingly, sampling can be performed at a lower rate than was possible in the prior art, thereby reducing the amount of data that needs to be processed.

Preferably, the sampling rate used is less than twice the Nyquist frequency of the composite bandwidth extending from the lowest frequency of the first band to the highest frequency of the second band. With this approach, the sampling rate is not prohibitively high for the case in which a large frequency separation exists between the two segregated bands, so that a single A/D converter can be employed to sample the filtered signal.

The system is particularly useful as part of a receiver in a wireless communications system in which a plurality of frequency channels within first and second segregated RF frequency bands are received. In this case, a single mixer stage is preferably utilized to down-convert the RF signals within the channels to a predetermined IF frequency range. The IF is then bandpass filtered at segregated IF frequency bands associated with the segregated RF bands. The A/D converter then converts the IF to a digitized output signal with the desired spectrum, to enable subsequent digital signal processing to extract the associated signal information of the channels. Accordingly, only a single mixer stage and A/D converter are employed to down-convert and digitize the signals within the segregated frequency bands, thereby providing a marked advantage over prior art systems which used multiple mixers and/or A/D converters.

BRIEF DESCRIPTION OF THE FIGURES

For a full understanding of the present invention, reference is had to an exemplary embodiment thereof, considered in conjunction with the accompanying figures in which like reference numerals designate like elements or features, for which.

DETAILED DESCRIPTION OF THE PREFERRED EMBODIMENTS

Figure 2:
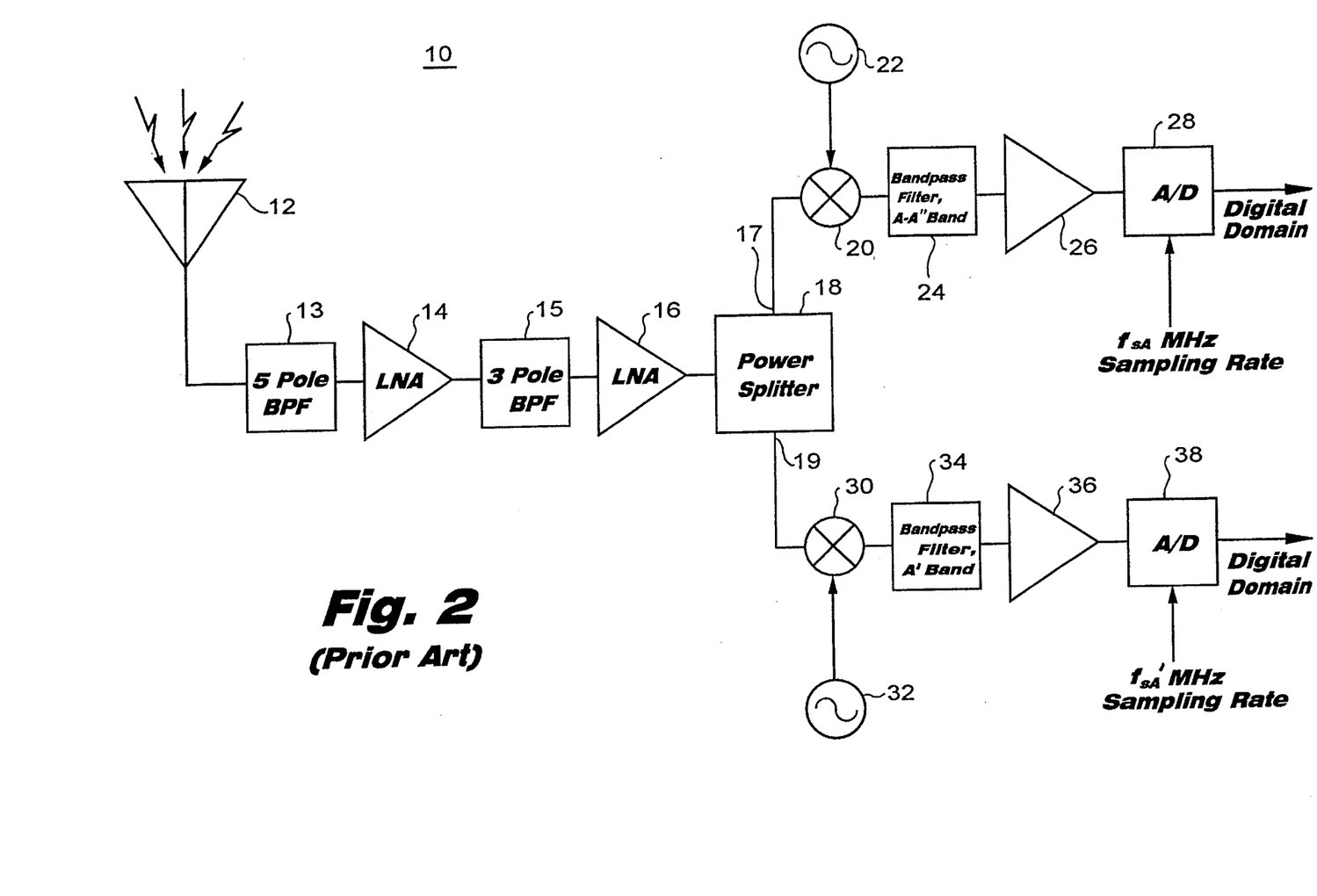
FIG. 2 is a prior art receiver front end portion of a wireless communications system.

To provide a foundation for the principles of the present invention, reference is first had to FIG. 2, which depicts a prior art receiving system 10. System 10 is of the dual-mixer and dual-A/D converter type and operates in the current example to isolate and digitize the frequencies of the non-contiguous A, A' and A" bands discussed previously in relation to FIG. 1.

In receiving system 10, antenna 12 receives the modulated RF signals of the entire spectrum of 824–849 MHz encompassing the A and B bands. Signals outside this spectrum are first filtered by five pole bandpass filter 13, then amplified by first low noise amplifier (LNA) 14, and filtered again by three pole bandpass filter 15. The use of the two filters 13 and 15 provides an overall filter response with a sharp rolloff at the desired band edges. The twice filtered spectrum is amplified again by LNA 16 and then split by splitter 18 between two output ports 17 and 19. The contiguous A and A" spectrums which will hereinafter be referred to as the A-A" spectrum, are isolated by employing mixer 20 in conjunction with local oscillator 22 to down-convert the entire 824–849 MHz spectrum to a corresponding IF spectrum, and then bandpass filtering the IF spectrum associated with the A-A" bands using bandpass filter 24. IF amplifier 26 amplifies the filtered A-A" IF spectrum, and the amplified output is applied to A/D converter 28 where it is sampled at a sampling frequency (rate) of $f_{SA}$ MHz.

In the other path, the A' spectrum is analogously down-converted and filtered via the use of mixer 30, local oscillator 32 and bandpass filter 34 that has a passband corresponding to the A' band portion of the down-converted IF spectrum. The filtered A' IF spectrum is likewise amplified by LNA 36 and applied to a second A/D converter 38 that uses a sampling rate of $f_{SA'}$ MHz. Since the A' frequency band is much narrower than the A-A" band, the sampling rate $f_{SA'}$ may be correspondingly lower than the sampling rate $f_{SA}$ of the A-A" band.

The B and B' frequency bands can analogously be down-converted, isolated and digitized using the system of FIG. 2. In this case, bandpass filters 24 and 34 would be designed with passbands corresponding to the down-converted B and B' spectrums, respectively, or vice versa. Alternatively, because the gap between the B and B' spectrums is relatively narrow, only one mixer, one A/D converter and so on, may be utilized whereupon the unwanted gap frequencies would be digitized but later ignored through subsequent digital signal processing.

Figure 3A:
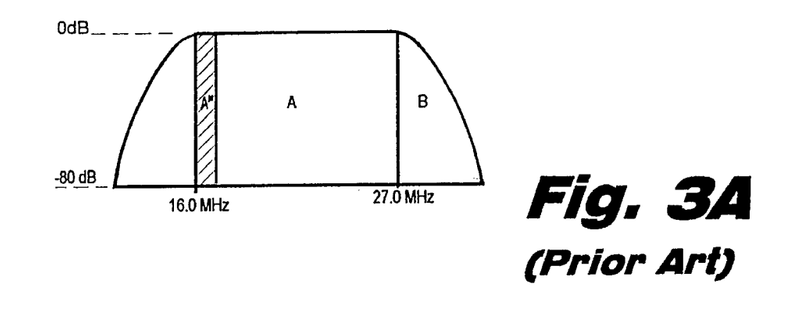
FIG. 3A depicts an IF spectrum within the system of FIG. 2.

Referring now to FIG. 3A, an exemplary A-A". IF spectrum passed by bandpass filter 24 is shown. The passband spectrum extends from 16 MHz to 27 MHz, with the spectrum outside the passband on each side gradually tapering off to −80 dB several MHz away. When this IF spectrum is sampled by A/D converter 28 at an exemplary sampling rate $f_{SA}$=30.72 MHz (which is greater than twice the 11 MHz signal bandwidth), the digital domain spectrum of FIG. 3B results. (When referring herein to the digital domain, the frequency spectrum of an A/D converter sampled waveform output is being referred to). It is seen that the input IF spectrum of FIG. 3A is periodically repeated in FIG. 3B at frequency intervals corresponding to the sampling rate. In addition, mirror images of the input spectrum appear in between these periodic spectrums. The varying amplitude (not shown) of the frequency components within the desired A-A" spectrums is also periodically duplicated. The spectral density of the A/D input signal appears at the same frequencies in the digital domain—e.g., 16–27 MHz in the current example. With this IF band as a reference, the spectrum then rotates or "folds" about multiples of one half the sampling frequency $f_{SA'}$, resulting in folds at 0 Hz, 15.36 MHz, 30.72 MHz, and so on.

Figure 3B:
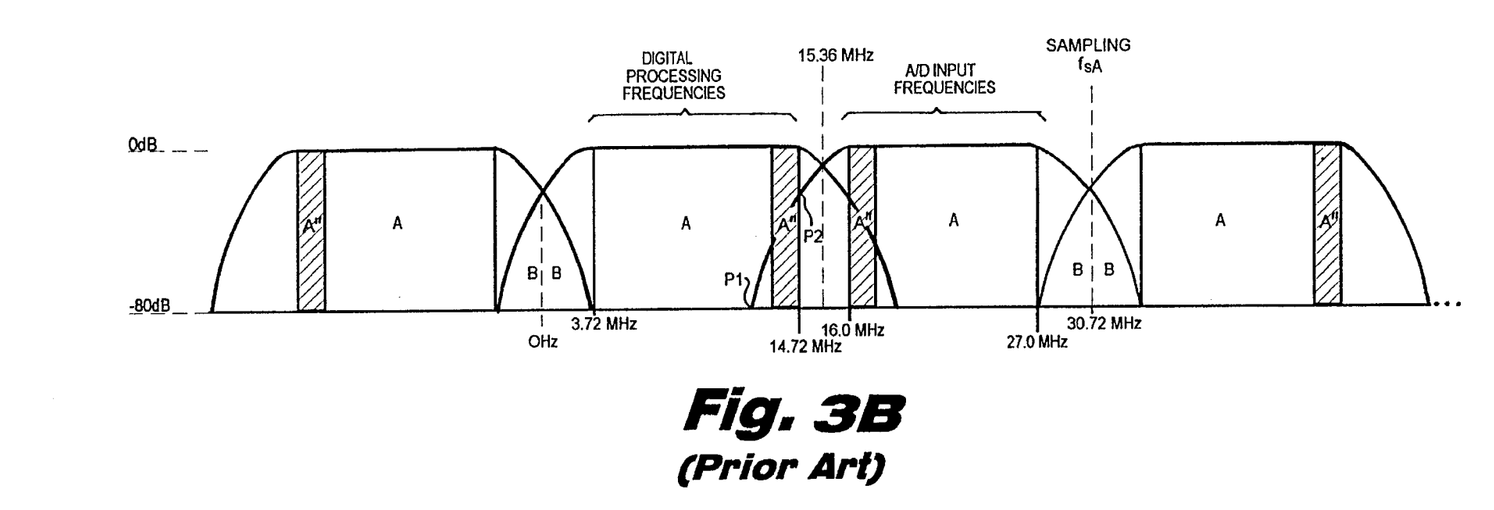
FIG. 3B shows a digital domain spectrum within the system of FIG. 2.

The periodicity of the spectral density in the digital domain is a basic property of sampled waveforms which can be predicted by computing the Fourier transform of the time sampled waveform. The higher the sampling rate, the wider will be the separation between the periodic waveforms. On the other hand, if the waveform is sampled at a rate of less than twice its signal bandwidth (the Nyquist bandwidth), an undesirable overlapping between the adjacent periodic spectrums will occur—a well known phenomenon known as aliasing. In FIG. 3B, the sampling rate is chosen so that there is no overlap between the "B" band and the A-A" band. Digital signal processing of the A-A" band can then be performed exclusive of the B band at frequencies of 3.72–14.72MHz. At the low end of this range, the A band frequencies can be processed without interference from signals outside the A-A" band greater than −80 dB relative to the passband level. At the high end of this range—i.e., between the points P1 and P2—the interference level from signals outside the passband is higher than −80 dB. As long as this interference level does not rise prohibitively high, adequate digital signal processing can still be performed. Otherwise, loss of information will begin to take place. Accordingly, it is apparent that both the sampling rate and the IF frequency band must be chosen appropriately in the prior art configuration to avoid the loss of information due to aliasing.

Referring again to FIG. 2, the mixing and filtering is performed in the other electrical path to produce a filtered IF signal containing the A' band signals. The sampling rate of A/D converter 38 is chosen to avoid loss of information in a similar manner to that just described for the A-A" band.

Figure 4:
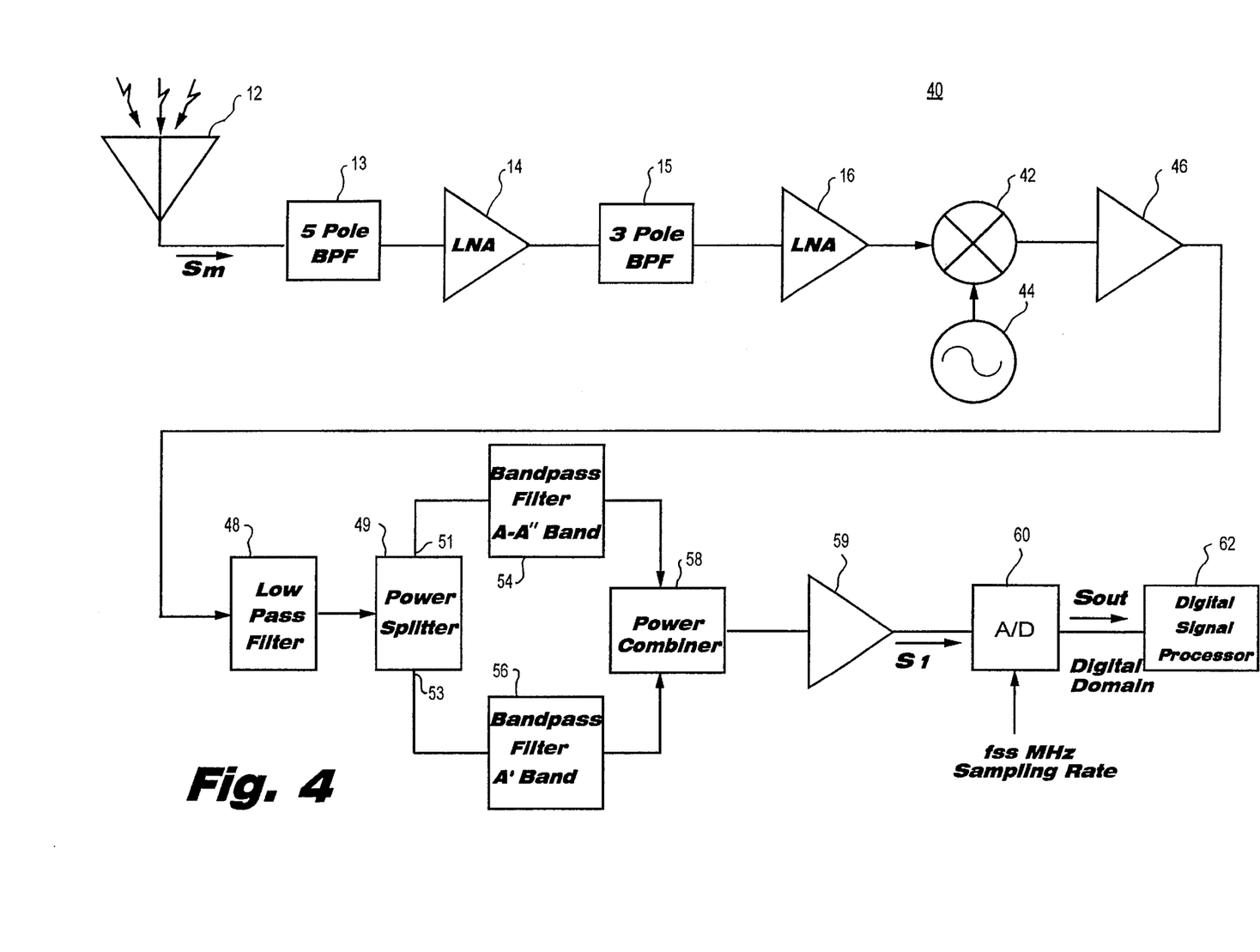
FIG. 4 is an embodiment of a receiving system of the present invention.

With reference now to FIG. 4, there is shown a block diagram of a receiver front end 40 in accordance with the present invention. Receiver front end 40 utilizes a single mixer 42 and single A/D converter 60 to capture and digitize the information within two non-contiguous frequency bands of interest. While receiver front end 40 will be described as operating to down-convert and digitize the aforementioned A-A" and A' non-contiguous frequency bands, it is understood that other segregated frequency bands can likewise be down-converted and digitized, and that the invention is not so limited to these bands.

Antenna 12 receives the signals within the 824–849 MHz band to provide a frequency multiplexed signal $S_m$ at the input of five pole bandpass filter 13. The signals within the segregated frequency bands A-A" and A' may be modulated RF signals of a multiplicity of frequency channels spaced 30 KHz apart within each band. Each one of these modulated RF signals may have originated from a wireless terminal. Each one of the frequency channels occupying 30 KHz of spectrum could, in turn, carry several subchannels in a Time Division Multiple Access (TDMA) format. Modulation schemes which could be employed include analog modulation such as frequency modulation (FM), as well as digital techniques such as phase shift keying (PSK) or frequency shift keying (FSK).

With bandpass filters 13 and 15 having passbands corresponding substantially to the composite frequency range of 824–849 MHz, the A-A", A', B and B' bands of the $S_m$ signal are passed, and amplified by the LNAs 14 and 16. The RF output of LNA 16 is then to down-converted to IF frequencies by means of mixer 42 and synthesized local oscillator 44. For example, if the local oscillating frequency is 803 MHz, then the RF spectrum from 824–849 MHz is translated to an IF frequency band of 21–46 MHz. The IF output of mixer 42 is then amplified by low noise IF amplifier 46 and the frequencies above 46 MHz are attenuated by low pass filter 48. Power splitter 49 then splits the low pass filtered IF between output ports 51 and 53. Coupled to the output port 51 is bandpass filter 54, which has a passband corresponding to the down-converted frequency range of the A-A" band—e.g., 21.0 to 32.0 Mhz in the illustrative example. In the other path, another bandpass filter 56 is coupled to output port 53 and has a passband corresponding to the down-converted frequency range of the A' band, which in the current example is from 42.0–43.5 MHz. The filtered outputs of the bandpass filters 54 and 56 are combined by power combiner 58, and then amplified by another IF amplifier 59 to produce an A/D input signal S1. Signal S1 is sampled by A/D converter 60 operating at a sampling rate of $f_{SS}$ MHz.

Figure 5A:
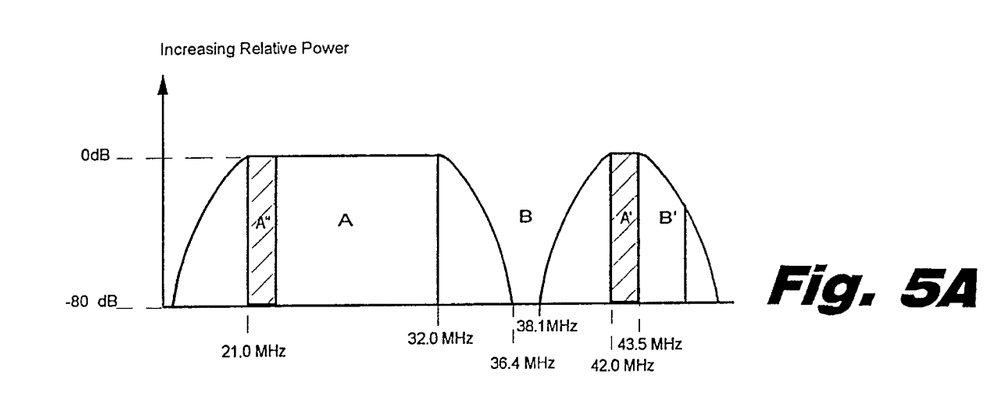
FIG. 5A shows an IF spectrum within the system of FIG. 4.

The spectrum of the A/D input signal S1 is depicted in FIG. 5A. As one can ascertain, frequencies outside the two passbands are attenuated to −80 dB relative to the signal power within the passbands. The −80 dB levels are reached several MHz away from each side of the passband edges, due to the non-ideal characteristics of bandpass filters 54 and 56. The filter responses are such that the central region of the down-converted B band—between 36.4–38.1 MHz in the example shown—has been attenuated by more than 80 dB. By highly attenuating the signals within this central region of the separation between the desired A-A" and A' spectrums, A/D conversion of the segregated A-A" and A' spectrums becomes possible at a sampling rate less than twice the total signal bandwidth of the composite spectrum. That is, sampling is possible at a rate less than 2×(43.5−21 MHz)=45 MHz. (Practically, a sampling rate of at least about 10% higher than twice the signal bandwidth would have to be used with the prior art methods). The technique used to achieve this lower sampling rate will be explained below.

It is noted that the spectrum shown in FIG. 5A is only indicative of the bandpass filter response—the actual signal power within and outside the two passbands varies in accordance with the carrier powers and modulation of the corresponding RF signals originally received. Hence, the passband frequencies which correspond to 0 dB power on the ordinate scale, have been attenuated in the bandpass filters by 0 dB (normalized to a predetermined reference value) whereas the frequencies corresponding to −80 dB have been attenuated in the filters by 80 dB (normalized to the same reference value). Stated another way, the shown power spectrum of signal S1 would be a completely accurate representation if the corresponding RF power was received at uniform power levels over the entire spectrum.

Figure 5B:
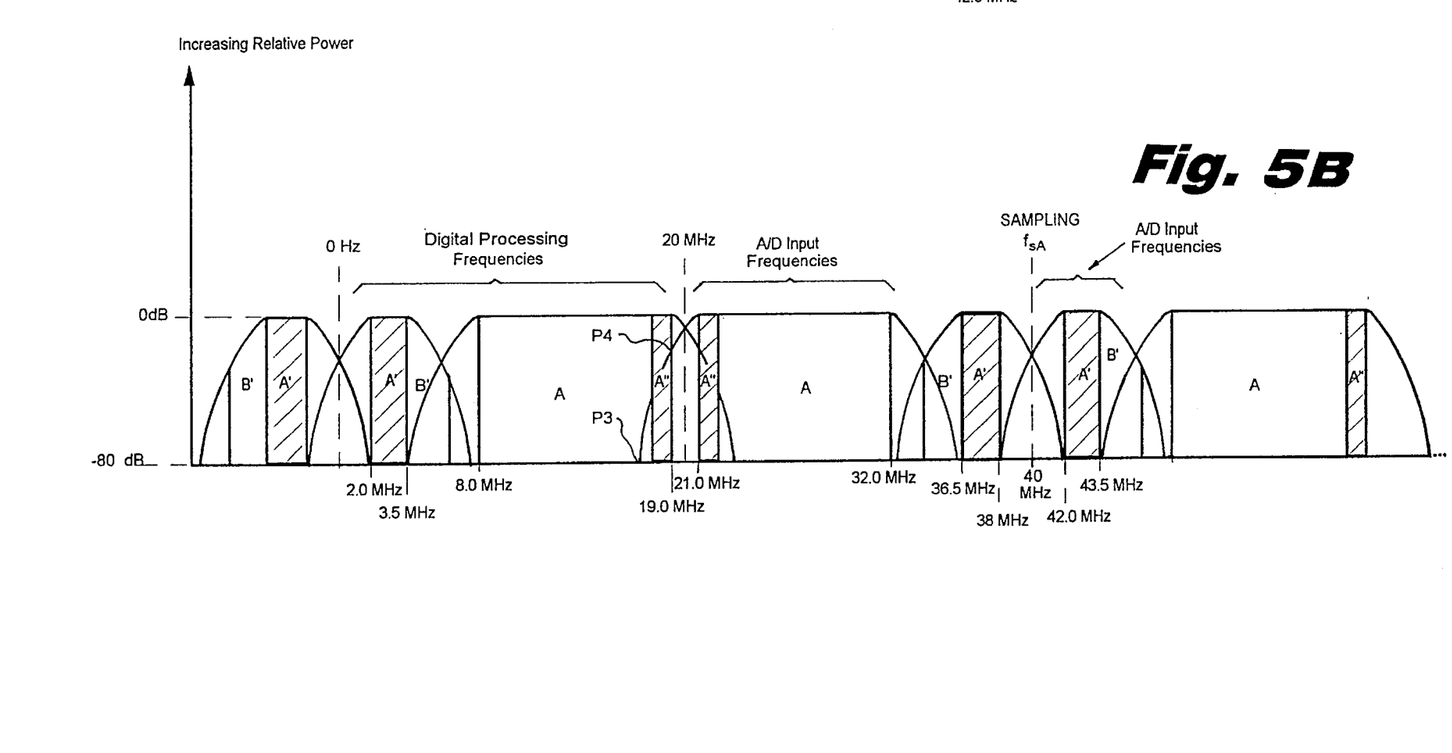
FIG. 5B illustrates a digital domain spectrum within the system of FIG. 4.

Referring now to FIG. 5B, there is shown an exemplary spectrum of a periodically sampled output signal $S_{out}$ of A/D converter 60. The shown spectrum is the digital domain spectrum that results from the IF spectrum of FIG. 5A being sampled at an exemplary sampling rate $f_{SS}$ of 40 MHz. This sampling rate is less than twice the bandwidth between the extremes of the desired segregated frequency bands A-A" and A'. Due to recent advances in A/D converter circuitry, A/D converters that can sample at a 40 MHz rate, and which exhibit sufficient dynamic range for this application, are currently available commercially from various manufacturers.

As explained previously in connection with the prior art systems, in the digital frequency domain the A/D input spectrum appears at the same frequencies at which it was applied. In addition, the spectrum rotates or folds periodically about itself at multiples of one half the sampling frequency or $f_{SS}/2$, which includes a fold about 0 Hz. Hence, using $f_{SS}$=40 MHz results in the spectrum rotating or folding about 0 Hz, 20 MHz, 40 MHz and so on. Considering for the moment only the fold about 20 MHz—if it weren't for the additional fold about 0 Hz, there would be a frequency gap of about 1.9–3.6 MHz, which gap would correspond to the attenuated central portion of the unwanted B band. That is, the frequency gap between 1.9–3.6 MHz is a mirror image replica of the frequency gap between 36.4–38.1 MHz. Due to the fold about 0 Hz, however, the A' spectrum appears within the frequency range of 2.0–3.5 MHz, within the mirror image frequency gap, which is the desired result. Digital signal processing of the A' and A-A" bands can then be performed by digital signal processor (DSP) 62 (shown in FIG. 4) without loss of signal information. A' band signal information loss would have otherwise been caused by the presence of the B band had it not been for the creation of the frequency gap replica from 1.9–3.6 MHz.

It is noted that the frequency gap just described between 1.9–3.6 MHz is an arbitrary one which corresponds to the region attenuated by greater than 80 dB in the bandpass filters. While −80 dB is in practice a low enough level to avoid interference with the desired signals, it is understood that higher or lower threshold levels can be used, depending upon the application. Variation in these threshold levels will directly affect the width of the presumed frequency gap between the filtered, non-contiguous spectrums (for a given filter response). One factor that needs to be considered in the selection of the threshold level is the dynamic range of the channelized signals within the bands. For instance, if some of the B band signals are received at much higher power levels than the A' signals, interference can occur within the 2–3.5 MHz range unless the threshold level is set low enough to account for this power level variation.

As a consequence of the A' and A-A" bands being positioned closer together between the range of 2–19 MHz in the example presented, digital signal processing can take place within DSP 62 over this frequency range to extract the individual baseband signals of the A' and A-A" bands. This processing will ignore the unwanted signal information carried by the frequencies between 3.5–8.0 MHz corresponding to the B and B' bands. While the digital signal processing is preferably performed at the lowest frequencies possible to extract the desired signals, it is understood that it could alternatively be performed at higher frequencies to extract the same information, such as between 21–38 MHz in the current example. In any case, suitable digital signal processors which can be used for DSP 62 to recover the baseband signals of a plurality of 30 KHz wide frequency channels within the segregated bands, are known in the art. For example, U.S. Pat. No. 5,289,464 to R. Wang and assigned to the assignee herein, the subject matter of which is incorporated herein by reference, discloses a digital signal processor which may be adapted to be used for DSP 62. The digital signal processor disclosed in that patent consists of a frequency bank analyzer which exponentially modulates the digital signal output from an A/D converter, then low pass filters and decimates such signals to yield a plurality of complex signals, each corresponding to a particular channel transmitted by an individual mobile terminal.

With continuing reference to FIG. 5B, it is noted that as a result of the fold about 20 MHz, the digital domain signals of the A-A" band between 8–19 MHz appear as a mirror image of the original A-A" band signals, and can be digitally processed as mirror images. Thus, in the digital domain, the signals of the A" portion are at the high end of the 8–19 MHz range whereas originally they were at the lower end of the 824–835 MHz A-A" band. Mirror images do not present a problem in the digital processing of these signals because they can be easily manipulated in the digital domain to produce the desired output. With the second fold about 0 Hz, the spectral components of the A' spectrum between 2–3.5 MHz appear in their original relative positions and are processed that way.

Accordingly, by sufficiently filtering the spectrum between two segregated frequency bands, and by digitizing the resulting bandpass filtered signal at a sampling frequency $f_{ss}$ of less than twice the Nyquist rate for the composite frequency range, the desired signal information within the segregated bands can be extracted. The sampling frequency $f_{ss}$ must be such as to place one of the segregated spectrums, in the digital domain, within the frequency gap created by filtering out the spectrum between the two non-contiguous bands. Consequently, the sampling frequency $f_{ss}$ and the IF frequency bands must be selected in view of one another to achieve this result.

Another factor which must be taken into account in the selection of the IF frequency band and the sampling rate to be used, is the interference due to aliasing caused by the signals outside the bandpass filter passbands. Thus in FIG. 5B, the RF signals that were originally directly lower in frequency than the A" band of 824–825 MHz now appear between the points P3 and P4 in the digital domain. In the current example, the power levels of RF signals originally received at those lower frequencies are substantially attenuated due to the sharp rolloff of bandpass filters 13, 15 and 54 (see FIG. 4). Therefore, signal information of the A" and A bands will not be lost due to interference. In practice, the RF signals directly outside the passbands of interest can be further attenuated to reduce aliasing interference by employing one or more notch filters (not shown) to filter out the undesired signals.

Referring again to FIG. 4, it is apparent that receiver front end 40 can be slightly modified in order to down-convert and digitize solely the B and B' band signals if so desired. Such modification may entail: 1) using an L.O. frequency of 812 MHz in the local oscillator 44 rather than 803 MHz; 2) replacing the A-A" bandpass filter 54 with a B band bandpass filter having a passband of 23–33 MHz, and 3) replacing the A' bandpass filter 56 with a B' band bandpass filter having a passband of 34.5–37 MHz. Then, by using the same sampling rate $f_{ss}$ of 40 MHz in the A/D converter 60, digital signal processing in the DSP 62 of the B' and B band signals can take place between 3–17 MHz. That is, in the digital domain, the B' band signals would lie between 3–5.5 MHz and the B band signals would lie between 7–17 MHz. It is noted that because the B and B' are close to one another, this latter approach is conventional in the sense that both B and B' spectrums are fit within the Nyquist bandwidth of the composite spectrum.

It will be understood that the embodiments described herein are merely exemplary and that one skilled in the art can make many modifications and variations to the disclosed embodiments without departing from the spirit and scope of the invention. For instance, while the embodiments have been described particularly in reference to non-contiguous frequency bands that are within standard cellular telephone spectrums, the invention is equally applicable to digitize signals of other non-contiguous frequency bands. A particular example is the new Personal Communications Systems (PCS) spectrums. Although the PCS frequency bands are contiguous, a provider may share or own one or more bands that may be segregated. In such a case the provider may desire simultaneous processing of the two or more bands with a common receiver in order to save on infrastructure costs. If a digitizing receiver is used, then the present invention offers this possibility with less cost because an additional down-conversion stage would not be required. Another example where the invention can be used is within the Global Station Management (GSM) spectrum.

Accordingly, all such variations and modifications to the disclosed embodiments are intended to be included within the scope of the invention as defined by the appended claims.

What is claimed is:

1. An apparatus for digitizing an electromagnetic input signal having frequency components within at least first and second segregated frequency bands, comprising:

a filtering circuit arrangement for passing only frequency components of said input signal substantially within said first and second frequency bands to provide a filtered signal having a spectrum with spectral components below a predetermined power level within a frequency gap between said first and second frequency bands; and an analog to digital (A/D) converter for sampling said filtered signal at a sampling rate sufficient to provide a digitized output signal having a frequency spectrum including spectral components of said filtered signal at corresponding frequencies thereof, and with a replica of spectral components of one of said frequency bands appearing within said frequency gap.

2. The apparatus according to claim 1, wherein said first frequency band is lower than said second frequency band, and wherein said sampling rate is lower than the Nyquist sampling rate for a composite of said first and second frequency bands, where said Nyquist sampling rate is defined as two times a bandwidth that extends continuously from a lowest frequency of said first frequency band to a highest frequency of said second frequency band.

3. The apparatus according to claim 1, wherein said filtering circuit arrangement comprises:

a power divider for splitting said input signal between first and second output ports thereof;

first and second bandpass filters respectively coupled to said first and second output ports, for substantially passing only signals of said first and second frequency bands, respectively, each said bandpass filter thereby providing a filtered output; and a power combiner for combining the filtered output from said first and second bandpass filters to provide said filtered signal.

4. The apparatus according to claim 3, further comprising a single mixer for down-converting an RF signal having frequency components within at least two non-contiguous RF frequency bands to produce an IF signal having frequency components within at least two associated non-contiguous IF frequency bands, and wherein said electromagnetic input signal comprises said IF signal.

5. The apparatus according to claim 4, further comprising an IF amplifier coupled between said power combiner and said A/D converter for amplifying said filtered signal prior to said filtered signal being digitized.

6. The apparatus according to claim 1, further including in combination therewith, a digital signal processor for processing said digitized output signal to extract baseband signals of said first and second frequency bands without substantial loss of signal information otherwise caused by interference with signals outside said first and second frequency bands.

7. The apparatus according to claim 6, wherein said predetermined power level is about −80 dB relative to power levels of frequency components within said first and second frequency bands.

8. The apparatus according to claim 1, wherein said A/D converter is operable to sample said filtered signal at a sampling rate of $f_{ss}$ MHz, and wherein said frequency spectrum of said digitized output signal comprises a periodic spectrum, said periodic spectrum repeating every $f_{ss}$ MHz, and further wherein said first frequency band is less than said second frequency band and wherein said frequency spectrum of said digitized output signal includes:

a mirror image replica of spectral components of said second frequency band appearing within said frequency gap;

a mirror image replica of spectral components of said first frequency band appearing over a third frequency band lower than said first frequency band; and a replica of spectral components of said second frequency band appearing over a fourth frequency band lower than said third frequency range, said fourth frequency band appearing within a replica of said frequency gap.

9. The apparatus according to claim 8, further including in combination therewith a digital signal processor for processing said digitized output signal to extract baseband signals of said first and second frequency bands without substantial loss of signal information otherwise caused by interference with signals outside said first and second frequency bands, said processing being performed over said third and fourth frequency bands.

10. The apparatus according to claim 8, wherein said first frequency band is from about 21–32 MHz, said second frequency band is from about 42–43.5 MHz and wherein $f_{ss}$ equals about 40 MHz.

11. In a wireless communications system including an antenna operable to receive a plurality of modulated radio frequency (RF) signals of a corresponding plurality of different frequency channels within at least first and second segregated RF frequency bands, said antenna operable to combine said RF signals to provide a frequency multiplexed input signal, a receiving apparatus for down-converting and digitizing said frequency multiplexed input signal, comprising:

a single down-converting mixer for translating frequency components of said input signal to corresponding intermediate frequency (IF) frequency components, thereby producing an IF signal having first and second segregated IF bands associated with said first and second RF frequency bands;

a filtering circuit arrangement for passing only frequency components of said IF signal substantially within said first and second frequency bands to provide a filtered IF signal having a spectrum with spectral components below a predetermined power level within a frequency gap between said first and second IF frequency bands; and an analog to digital (A/D) converter for sampling said filtered IF signal at a sampling rate sufficient to provide a digitized output signal having a frequency spectrum with corresponding spectral components of said filtered signal, and with a replica of spectral components of one of said IF frequency bands appearing within said frequency gap.

12. The receiving apparatus according to claim 11, wherein said first frequency band is lower than said second frequency band, and wherein said receiving apparatus further includes:

a five pole bandpass filter coupled to said antenna, having a passband corresponding substantially to a composite bandwidth of said first and second frequency bands, said composite bandwidth extending from a lowest frequency of said first band to a highest frequency of said second band, said five pole bandpass filter operable to filter said frequency multiplexed input signal to provide a filtered input signal;

a first low noise amplifier (LNA) for amplifying said filtered input signal to provide an amplified, filtered input signal;

a three pole bandpass filter, coupled between said first LNA and said mixer and having a passband corresponding substantially to said composite frequency band;

a second LNA coupled between said three pole bandpass filter and said mixer;

an IF amplifier coupled between said mixer and said filtering circuit arrangement; and a low pass filter coupled between said IF amplifier and said filtering circuit arrangement, for attenuating frequencies higher than said first and second IF frequency bands.

13. The receiving apparatus according to claim 11, wherein said filtering circuit arrangement comprises:

a power divider for splitting said IF input signal between first and second output ports thereof;

first and second bandpass filters respectively coupled to said first and second output ports, for substantially passing only signals of said first and second IF frequency bands, respectively, each said bandpass filter thereby providing a filtered output; and a power combiner for combining the filtered output from said first and second bandpass filters to provide said filtered IF signal.

14. The receiving apparatus according to claim 3, further comprising a local oscillator for supplying a local oscillating signal to said mixer to mix with said input RF signal to produce said IF signal; and an IF amplifier coupled between said power combiner and said A/D converter for amplifying said filtered IF signal prior to digitization by said A/D converter.

15. The receiving apparatus according to claim 11, wherein said first frequency band is lower than said second frequency band, and wherein said sampling rate is lower than the Nyquist sampling rate for a composite of said first and second frequency bands, where said Nyquist sampling rate is defined as two times a bandwidth that extends continuously from a lowest frequency of said first frequency band to a highest frequency of said second frequency band.

16. A method for processing a frequency multiplexed analog input signal having frequency components within at least first and second non-contiguous frequency bands, comprising:

filtering out frequency components of said input signal that are outside said non-contiguous frequency bands to provide a filtered signal having a frequency gap between said first and second frequency bands, said frequency gap defined by power spectral components below a predetermined threshold; and periodically sampling said filtered signal at a sampling rate sufficient to produce a digitally sampled output signal having a frequency spectrum including spectral components of said filtered signal at corresponding frequencies thereof, and also including a replica of spectral components of one of said frequency bands appearing within said frequency gap.

17. The method according to claim 16, further comprising in combination therewith, mixing with a local oscillating signal, a frequency multiplexed RF signal having frequency components within at least first and second segregated RF bands to produce an intermediate frequency (IF) signal, wherein said frequency multiplexed analog input signal comprises said IF signal.

18. The method according to claim 16, wherein:

said second frequency band is higher than said first frequency band;

said sampling rate is $f_{SS}$ MHz, thereby producing a spectrum of said digitally sampled output signal which is a periodic spectrum of said filtered signal spectral components, said periodic spectrum repeating every $f_{SS}$ MHz and folding about itself every $f_{SS}/2$ MHz, whereby a mirror image replica of the spectral components of said second frequency band appears within a third frequency band lower than said frequencies of said first frequency band, and a replica of spectral components of said second frequency band appears within a fourth frequency band lower than said third frequency band.

19. The method according to claim 18, wherein said analog input signal contains a plurality of frequency channels with each frequency channel containing associated baseband signals, and further including:

digitally processing spectral components of said third and fourth frequency bands to extract said associated baseband signals of said plurality of frequency channels.

* * * * *